US011177332B2

(12) United States Patent
Yu (10) Patent No.: US 11,177,332 B2
(45) Date of Patent: Nov. 16, 2021

(54) TFT ARRAY SUBSTRATE REQUIRING FEWER MASKS AND METHOD FOR MANUFACTURING THE SAME AND OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Yun Yu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 27 days.

(21) Appl. No.: 16/644,967

(22) PCT Filed: Feb. 21, 2019

(86) PCT No.: PCT/CN2019/075633
§ 371 (c)(1),
(2) Date: Mar. 6, 2020

(87) PCT Pub. No.: WO2020/124774
PCT Pub. Date: Jun. 25, 2020

(65) Prior Publication Data
US 2020/0335566 A1      Oct. 22, 2020

(30) Foreign Application Priority Data

Dec. 18, 2018   (CN) .......................... 201811551317.9

(51) Int. Cl.
*H01L 27/32*       (2006.01)
*H01L 27/12*       (2006.01)

(52) U.S. Cl.
CPC ...... *H01L 27/3262* (2013.01); *H01L 27/3248* (2013.01); *H01L 27/3258* (2013.01);
(Continued)

(58) Field of Classification Search
CPC ............. H01L 27/3262; H01L 27/3248; H01L 27/3258; H01L 27/3265; H01L 27/1255; H01L 2227/323
See application file for complete search history.

(56) References Cited

U.S. PATENT DOCUMENTS

2008/0251790 A1* 10/2008 Cheng ................. H01L 27/1255
257/59
2012/0074408 A1*  3/2012 Moon ................. H01L 27/3262
257/57
(Continued)

*Primary Examiner* — Lex H Malsawma
(74) *Attorney, Agent, or Firm* — The Roy Gross Law Firm, LLC; Roy Gross (57) ABSTRACT

A TFT array substrate and a method for manufacturing the same and an OLED display panel are provided. The method for manufacturing the TFT array substrate uses a mask to form an active pattern, a gate, a first electrode, a via and an opening in an interlayer dielectric layer and a gate insulating layer, a source, a drain, an opening in a planarization layer, and a spacer, respectively. The number of required masks is small and the processes are simple, which effectively improves the production efficiency and reduces the product cost.

10 Claims, 7 Drawing Sheets

(52) U.S. Cl.
CPC ...... *H01L 27/3265* (2013.01); *H01L 27/1255* (2013.01); *H01L 2227/323* (2013.01)

(56) References Cited

U.S. PATENT DOCUMENTS

| | | | |
|---|---|---|---|
| 2012/0104399 A1* | 5/2012 | Choi | H01L 27/3265 257/59 |
| 2013/0015459 A1* | 1/2013 | Lee | H01L 27/1255 257/72 |
| 2015/0108450 A1* | 4/2015 | Son | H01L 27/3276 257/40 |
| 2015/0187853 A1* | 7/2015 | Jin | H01L 27/3262 257/40 |

* cited by examiner

TFT ARRAY SUBSTRATE REQUIRING FEWER MASKS AND METHOD FOR MANUFACTURING THE SAME AND OLED DISPLAY PANEL

FIELD OF INVENTION

The present invention generally relates to the display technology and, more particularly, to a thin-film transistor (TFT) array substrate and a method for manufacturing the same and an organic light-emitting diode (OLED) display device.

BACKGROUND OF INVENTION

Organic light-emitting diode (OLED) display devices have been considered as the most promising display devices in the industry because they have many advantages such as self-luminescence, low driving voltage, high luminescent efficiency, short response time, high definition and contrast, near 180° viewing angle, wide temperature range, the feasibility of flexible and large-area full-color display, and so on.

Based on the driving methods, OLEDs can be classified into two types: the passive-matrix OLED (PMOLED) and the active-matrix OLED (AMOLED), namely the direct-addressing type and thin-film transistor (TFT) matrix addressing type. Among them, the AMOLED has pixels arranged in an array, which belongs to the active-matrix display type, has high luminescent efficiency, and is usually used as a high-definition large-sized display device.

An OLED display device generally includes a substrate, an anode disposed on the substrate, a hole-injection layer disposed on the anode, a hole-transport layer disposed on the hole-injection layer, a light-emitting layer disposed on the hole-transport layer, an electron-transport layer disposed on the light-emitting layer, an electron-injection layer disposed on the electron-transport layer, and a cathode disposed on the electron-injection layer. The principle of luminescence of an OLED display device is that carriers are driven by the electric field to inject and recombine in the semiconductor materials and the organic luminescent materials to cause luminescence. Specifically, an OLED display device generally uses an indium-tin oxide (ITO) pixel electrode and a metal electrode as the anode and the cathode of the device, respectively. Under a certain driving voltage, electrons and holes are respectively injected from the cathode and the anode to the electron-transport layer and the hole-transport layer. Electrons and holes migrate and meet in the light-emitting layer through the electron-transport layer and the hole-transport layer, respectively, to form excitons to excite the light-emitting molecules and emit visible light through radiation relaxation.

Figure 1:
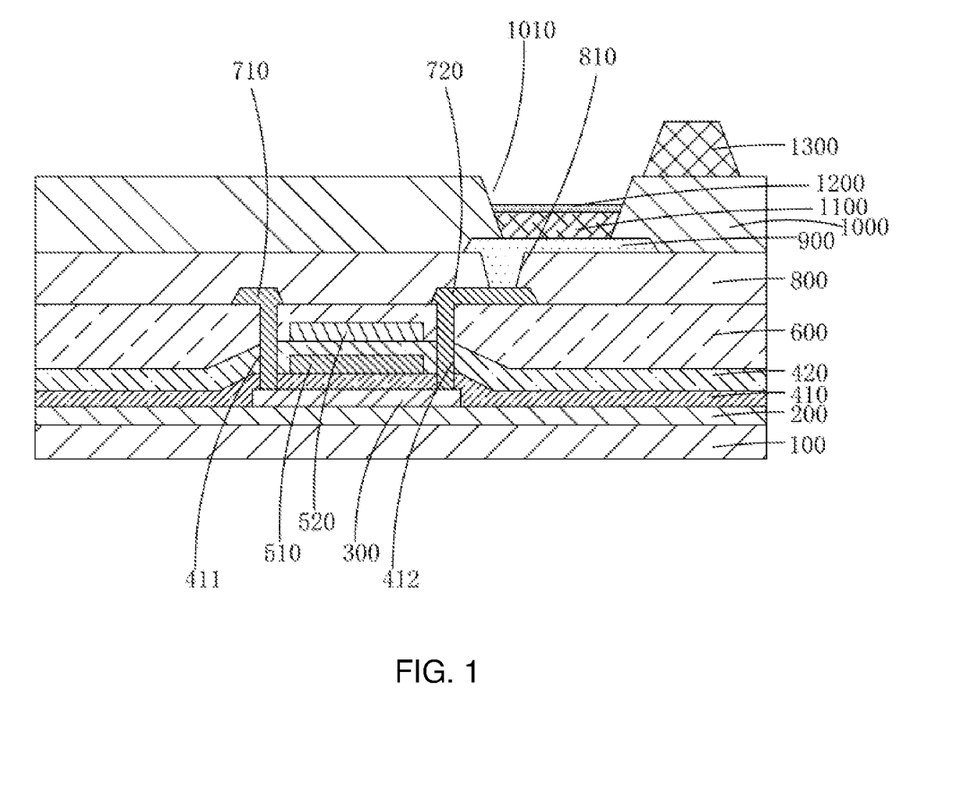
FIG. 1 is a schematic structural diagram of a conventional OLED display panel.

Referring to FIG. 1, a conventional OLED display panel includes a base substrate 100, a barrier layer 200 disposed on the base substrate 100, an active layer 300 disposed on the barrier layer 200, a first gate insulating layer 410 disposed on the active layer 300 and the barrier layer 200, a first gate 510 disposed on the first gate insulating layer 410 and above the active layer 300, a second gate insulating layer 420 disposed on the first gate insulating layer 410 and the first gate 510, a second gate 520 disposed on the second gate insulating layer 420 and above the first gate 510, an interlayer dielectric layer 600 disposed on the second gate 520 and the second gate insulating layer 420, a source 710 and a drain 720 disposed on the interlayer dielectric layer 600, a planarization layer 800 disposed on the source 710, the drain 720, and the interlayer dielectric layer 600, a first electrode 900 disposed on the planarization layer 800, a pixel defining layer 1000 disposed on the first electrode 900 and the planarization layer 800, an organic light-emitting layer 1100 disposed on the first electrode 900, a second electrode 1200 disposed on the organic light-emitting layer 1100, and a spacer 1300 disposed on the pixel defining layer 1000. The first gate insulating layer 410, the second gate insulating layer 420 and the interlayer dielectric layer 600 are provided with a first via 411 and a second via 412 disposed on the active layer 300, such that the source 710 and the drain 720 are respectively in contact with two ends on the active layer 300 through the first via 411 and the second via 412. The planarization layer 800 is provided with a third via 810 disposed on the drain 720, such that the first electrode 900 is in contact with the drain 720 through the third via 810. The pixel defining layer 1000 is provided with an opening 1010 on the first electrode 900. The organic light-emitting layer 1100 and the second electrode 1200 are both disposed in the opening 1010. A capacitor is formed between the first gate 510 and the second gate 520. In the manufacture of the OLED display panel, nine mask processes are required to form the active layer 300, the first gate 510, the second gate 520, the first via 411 and the second via 412, the source 710 and the drain 720, the third via 810, the first electrode 900, the opening 1010, and the spacer 1300. Due to the large number of required masks, the manufacturing processes are complicated, which increases the product cost of the OLED display panel.

SUMMARY OF INVENTION

One object of the present invention is to provide a method for manufacturing a thin-film transistor (TFT) array substrate, which requires a small number of masks and simple manufacturing processes to effectively lower the product cost.

Another object of the present invention is to provide a TFT array substrate, which is manufactured with a small number of masks and simple manufacturing processes to effectively lower the product cost.

A further object of the present invention is to provide an OLED display panel, which is manufactured with a small number of masks and simple manufacturing processes to effectively lower the product cost.

In order to achieve the foregoing objects, the present invention firstly provides a method for manufacturing a TFT array substrate, which includes the following steps:

Step S1, providing a base substrate, on which a semiconductor material film is formed and patterned to form a first semiconductor pattern;

Step S2, forming a gate insulating layer on the first semiconductor pattern and the substrate;

Step S3, forming and patterning a first metal film on the gate insulating layer to form a gate above the first semiconductor pattern, the gate exposing both ends of the first semiconductor pattern;

Step S4, doping the first semiconductor pattern using the gate as a mask to form an active pattern;

Step S5, forming and patterning a conductive material film on the gate insulating layer to form a first electrode spaced apart from the active pattern in a horizontal direction;

Step S6, forming an interlayer dielectric layer on the first electrode, the gate and the gate insulating layer, and patterning the interlayer dielectric layer and the gate insulating layer to form a first opening above the first electrode and form a first via and a second via respectively above both ends of the active pattern; and Step S7, forming and patterning a second metal film on the first electrode and the interlayer dielectric layer to form a source and a drain spaced apart from each other, the source and the drain being in contact with the both ends of the active pattern through the first via and the second via, respectively, and one end of the source adjacent to the first electrode being in contact with one end of the first electrode adjacent to the source through the first opening.

In Step S1, a barrier layer is formed on the base substrate before the semiconductor material film is formed such that the semiconductor material film is formed on the barrier layer.

In Step S2, the gate insulating layer is formed on the first semiconductor pattern and the barrier layer.

The method further includes the steps of:

Step S8, forming and patterning a planarization layer on the interlayer dielectric layer, the first electrode, the source and the drain to form a second opening in the first opening above the first electrode; and Step S9, forming and patterning an organic material film on the planarization layer to form a spacer.

In Step S1, a second semiconductor pattern spaced apart from the first semiconductor pattern is formed while patterning the semiconductor material film to form the first semiconductor pattern.

In Step S2, the gate insulating layer is further formed on the second semiconductor pattern.

In Step S4, the second semiconductor pattern is doped to form a first capacitor plate while doping the first semiconductor pattern using the gate as a mask to form the active pattern.

The first electrode formed in Step S5 is spaced apart from the first capacitor plate in the horizontal direction.

In Step S6, a third opening is formed above the gate insulating layer on the first capacitor plate while patterning the interlayer dielectric layer and the gate insulating layer to form the first opening, the first via, and the second via.

In Step S7, a second capacitor plate spaced apart from the source and the drain is formed while patterning the second metal film to form the source and the drain, and the second capacitor plate is disposed above the first capacitor plate and covers the third opening.

The active pattern includes a channel corresponding to the gate and a source contact region and a drain contact region disposed at both ends of the channel, respectively.

The first via and the second via are respectively disposed above the source contact region and the drain contact region such that the source and the drain are respectively connected to the source contact region and the drain contact region through the first via and the second via.

In Step S1, the barrier layer is formed on the base substrate by plasma-enhanced chemical vapor deposition, and the barrier layer includes a silicon oxide layer, a silicon nitride layer, or a stacked structure including a silicon oxide layer and a silicon nitride layer.

The semiconductor material film includes a polycrystalline silicon film, and forming the semiconductor material film on the barrier layer in Step S1 specifically includes: forming a single-crystalline silicon film on the barrier layer by plasma-enhanced chemical vapor deposition and subjecting the single-crystalline silicon film to excimer laser annealing to form the polycrystalline silicon film.

In Step S2, the gate insulating layer is formed on the first semiconductor pattern and the barrier layer by plasma-enhanced chemical vapor deposition, and the gate insulating layer includes a silicon oxide layer, a silicon nitride layer, or a stacked structure including a silicon oxide layer and a silicon nitride layer.

In Step S3, the first metal film is formed on the gate insulating layer by physical vapor deposition, and the first metal film includes one of a single-layer molybdenum film, a single-layer chromium film, a single-layer tungsten-molybdenum film, an aluminum film sandwiched between two titanium films, and an aluminum film sandwiched between two molybdenum films.

In Step S5, the conductive material film is formed on the gate insulating layer by physical vapor deposition, and the conductive material film includes an aluminum film sandwiched between two indium-tin oxide films or a stacked structure including a single-layer indium-tin oxide film, a single-layer aluminum film and a single-layer indium-zinc oxide film.

In Step S6, the interlayer dielectric layer is formed on the first electrode, the gate and the gate insulating layer by plasma-enhanced chemical vapor deposition, and the interlayer dielectric layer includes a silicon oxide layer, a silicon nitride layer or a stacked structure including a silicon oxide layer and a silicon nitride layer.

In Step S7, the second metal film is formed on the first electrode and the interlayer dielectric layer by physical vapor deposition, and the second metal film includes an aluminum film sandwiched between two titanium films or an aluminum film sandwiched between two molybdenum films.

In Step S8, the planarization layer is coated on the interlayer dielectric layer, the first electrode, the source and the drain by a coating machine, and the planarization layer includes an organic material.

In Step S9, the organic material film is coated on the planarization layer by a coating machine.

The present invention further provides a TFT array substrate, including a base substrate, an active pattern disposed on the base substrate, a gate insulating layer disposed on the base substrate and the active pattern, a gate disposed on the gate insulating layer and above the active pattern, a first electrode disposed on the gate insulating layer and spaced apart from the active pattern in a horizontal direction, an interlayer dielectric layer disposed on the first electrode, the gate and the gate insulating layer, and a source and a drain disposed on the interlayer dielectric layer and spaced apart from each other.

The gate exposes both ends of the active pattern, the interlayer dielectric layer is provided with a first opening above the first electrode, the interlayer dielectric layer and the gate insulating layer are respectively provided with a first via and a second via disposed above the both ends of the active pattern, the source and the drain are in contact with the both ends of the active pattern through the first via and the second via, respectively, and one end of the source adjacent to the first electrode is in contact with one end of the first electrode adjacent to the source through the first opening.

The TFT array substrate further includes a barrier layer disposed on the base substrate, a first capacitor plate disposed on the barrier layer and spaced apart from the active pattern, a second capacitor plate disposed on the interlayer dielectric layer and spaced apart from the source and the drain, a planarization layer disposed on the interlayer dielectric layer, the first electrode, the source, the drain and the second capacitor plate, and a spacer disposed on the planarization layer.

The active pattern is disposed on the barrier layer, the gate insulating layer is disposed on the active pattern, the barrier layer and the first capacitor plate, the first electrode is spaced apart from the first capacitor plate in the horizontal direction, the planarization layer is provided with a second opening above the first electrode in the first opening, the interlayer dielectric layer forms a third opening above the gate insulating layer on the first capacitor plate, the second capacitor plate is disposed above the first capacitor plate and covers the third opening.

The barrier layer includes a silicon oxide layer, a silicon nitride layer, or a stacked structure including a silicon oxide layer and a silicon nitride layer.

The active pattern and the second capacitor plate include polycrystalline silicon, and the both ends of the active pattern exposed by the gate and the second capacitor plate are ion-doped.

The gate insulating layer includes a silicon oxide layer, a silicon nitride layer, or a stacked structure including a silicon oxide layer and a silicon nitride layer.

The gate includes one of a single-layer molybdenum film, a single-layer chromium film, a single-layer tungsten-molybdenum film, an aluminum film sandwiched between two titanium films, and an aluminum film sandwiched between two molybdenum films.

The first electrode includes an aluminum film sandwiched between two indium-tin oxide films or a stacked structure including a single-layer indium-tin oxide film, a single-layer aluminum film and a single-layer indium-zinc oxide film.

The interlayer dielectric layer includes a silicon oxide layer, a silicon nitride layer, or a stacked structure including a silicon oxide layer and a silicon nitride layer.

The source, the drain and the second capacitor plate include an aluminum film sandwiched between two titanium films or an aluminum film sandwiched between two molybdenum films.

The planarization layer includes an organic material.

The active pattern includes a channel corresponding to the gate and a source contact region and a drain contact region disposed at both ends of the channel, respectively.

The first via and the second via are respectively disposed above the source contact region and the drain contact region such that the source and the drain are respectively connected to the source contact region and the drain contact region through the first via and the second via.

The present invention further provides an OLED display panel, including the foregoing TFT array substrate.

Beneficial effects of the present invention—the method for manufacturing a TFT array substrate according to the present invention uses a mask to form an active pattern, a gate, a first electrode, a via and an opening in an interlayer dielectric layer and a gate insulating layer, a source, a drain, an opening in a planarization layer, and a spacer, respectively. The number of required masks is small and the processes are simple, which effectively improves the production efficiency and reduces the product cost. The TFT array substrate according to the present invention is manufactured with a small number of required masks, simple processes, and reduced product cost. The OLED display panel according to the present invention is manufactured with a small number of required masks, simple processes, and reduced product cost.

DESCRIPTION OF DRAWINGS

For a better understanding of the features and technical aspects of the present invention, please refer to the following detailed description and accompanying drawings of the present invention. However, the accompanying drawings are only for reference and description, and are not intended to limit the present invention. Among the accompanying drawings.

DETAILED DESCRIPTION OF PREFERRED EMBODIMENTS

In order to further clarify the technical means adopted by the present invention and its effects, the following is a detailed description in conjunction with preferred embodiments of the present invention and the accompanying drawings.

Figure 2:
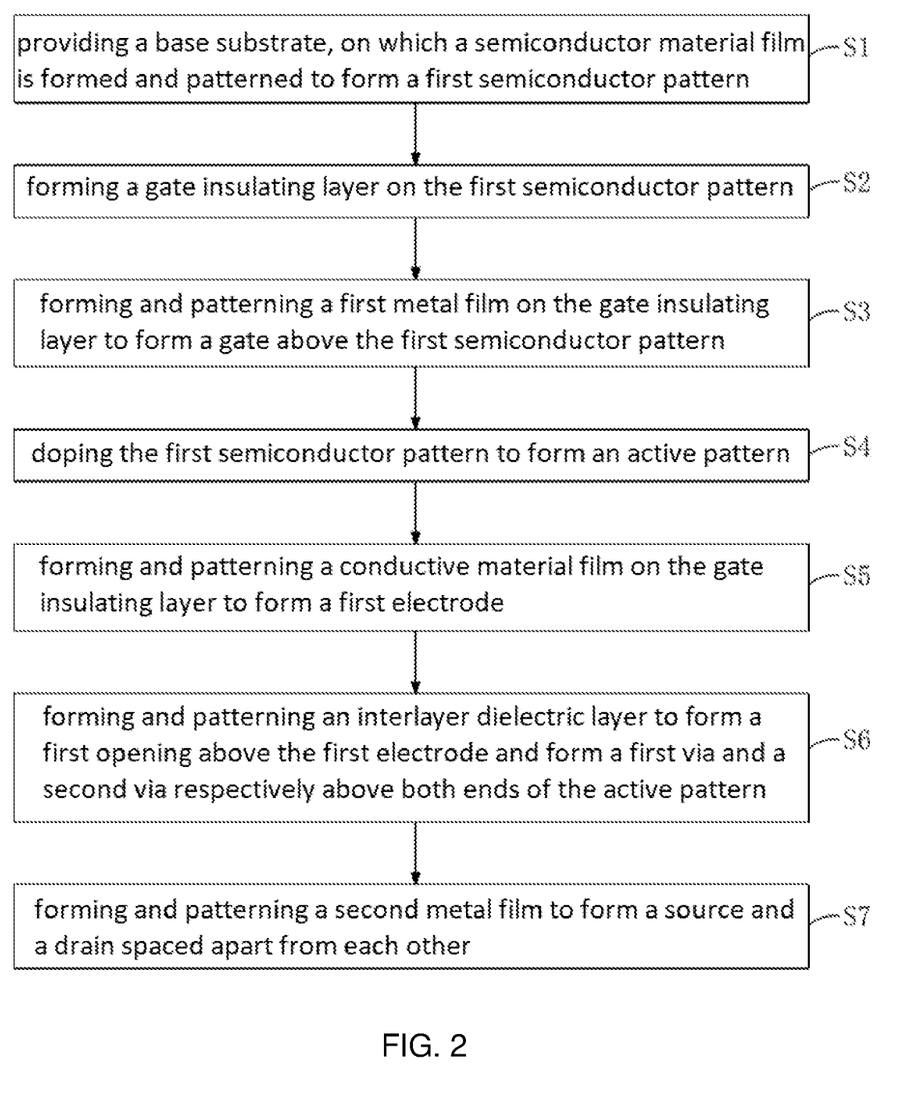
FIG. 2 is a flowchart showing a method for manufacturing a TFT array substrate according to the present invention.
Figure 3:
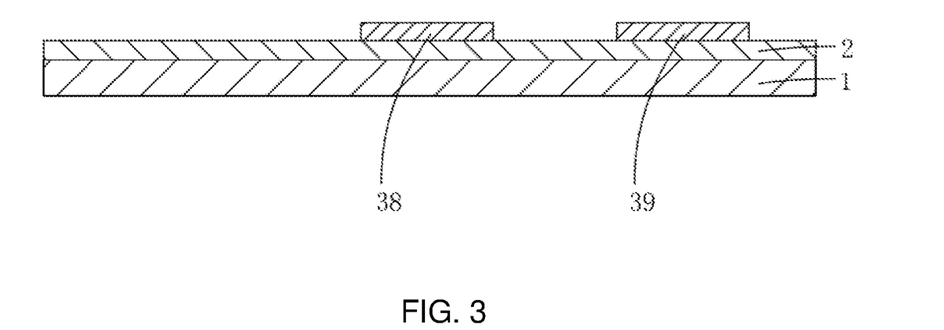
FIG. 3 is a schematic diagram showing Step S1 of a method for manufacturing a TFT array substrate according to the present invention.

Referring to FIG. 2, the present invention provides a method for manufacturing a TFT array substrate, which includes the following steps:

In Step S1, referring to FIG. 3, a base substrate 1 is provided, and a semiconductor material film is formed on the base substrate 1 and patterned by using a first mask to form a first semiconductor pattern 38 and a second semiconductor pattern 39 spaced apart from each other.

Specifically, in Step S1, a barrier layer 2 is formed on the base substrate 1 before the semiconductor material film is formed on the base substrate 1, such that the semiconductor material film is formed on the barrier layer 2.

Specifically, in Step S1, the barrier layer 2 is formed on the base substrate 1 by plasma-enhanced chemical vapor deposition (PECVD). The barrier layer 2 includes a silicon oxide layer, a silicon nitride layer, or a stacked structure including a silicon oxide layer and a silicon nitride layer.

Specifically, semiconductor material film includes a polycrystalline silicon film, and forming the semiconductor material film on the barrier layer 2 in Step S1 specifically includes: forming a single-crystalline silicon film on the barrier layer 2 by plasma-enhanced chemical vapor deposition and subjecting the single-crystalline silicon film to excimer laser annealing to form the polycrystalline silicon film.

Figure 4:
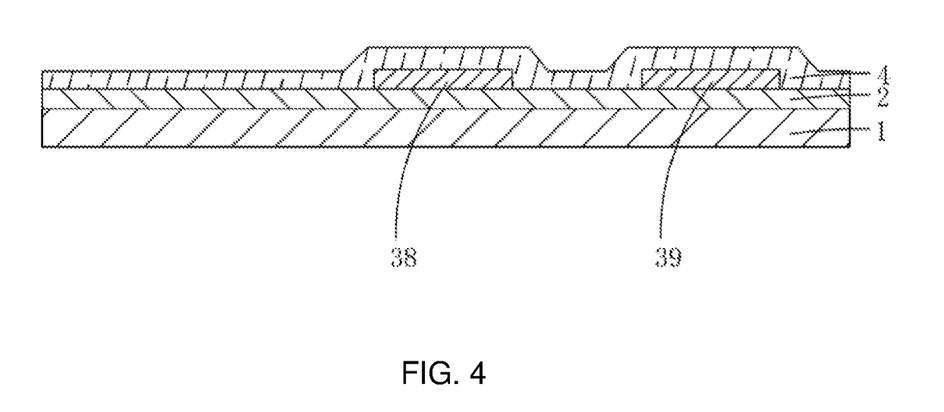
FIG. 4 is a schematic diagram showing Step S2 of a method for manufacturing a TFT array substrate according to the present invention.

In Step S2, referring to FIG. 4, a gate insulating layer 4 is formed on the first semiconductor pattern 38, the second semiconductor pattern 39 and the base substrate 1.

Specifically, in Step S2, the gate insulating layer 4 is formed on the first semiconductor pattern 38, the second semiconductor pattern 39 and the barrier layer 2.

Specifically, in Step S2, the gate insulating layer 4 is formed on the first semiconductor pattern 38, the second semiconductor pattern 39, and the barrier layer 2 by plasma-enhanced chemical vapor deposition. The gate insulating layer 4 includes a silicon oxide layer, a silicon nitride layer, or a stacked structure including a silicon oxide layer and a silicon nitride layer.

Figure 5:
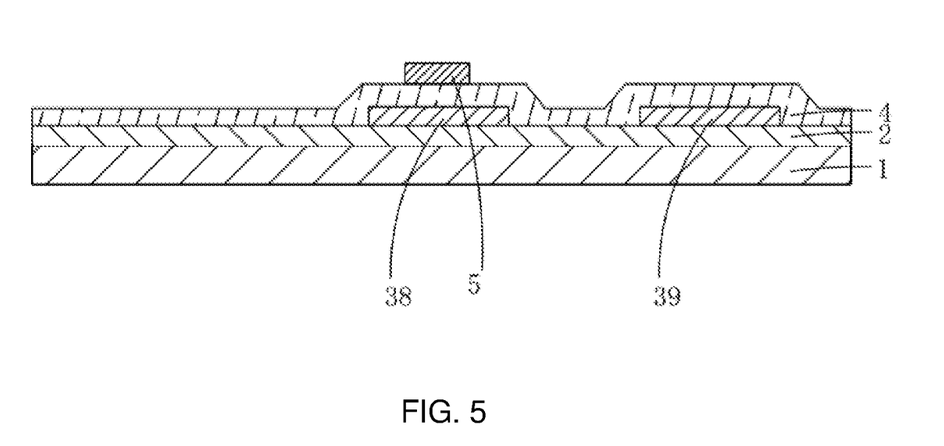
FIG. 5 is a schematic diagram showing Step S3 of a method for manufacturing a TFT array substrate according to the present invention.

In Step S3, referring to FIG. 5, a first metal film is formed on the gate insulating layer 4 and patterned by using a second mask to form a gate 5 above the first semiconductor pattern 38. The gate 5 exposes both ends of the first semiconductor pattern 38.

Specifically, in Step S3, the first metal film is formed on the gate insulating layer 4 by physical vapor deposition (PVD). The first metal film includes one of a single-layer molybdenum (Mo) film, a single-layer chromium (Cr) film, a single-layer tungsten-molybdenum (MoW) film, an aluminum (Al) film sandwiched between two titanium (Ti) films, and an aluminum (Al) film sandwiched between two molybdenum (Mo) films.

Figure 6:
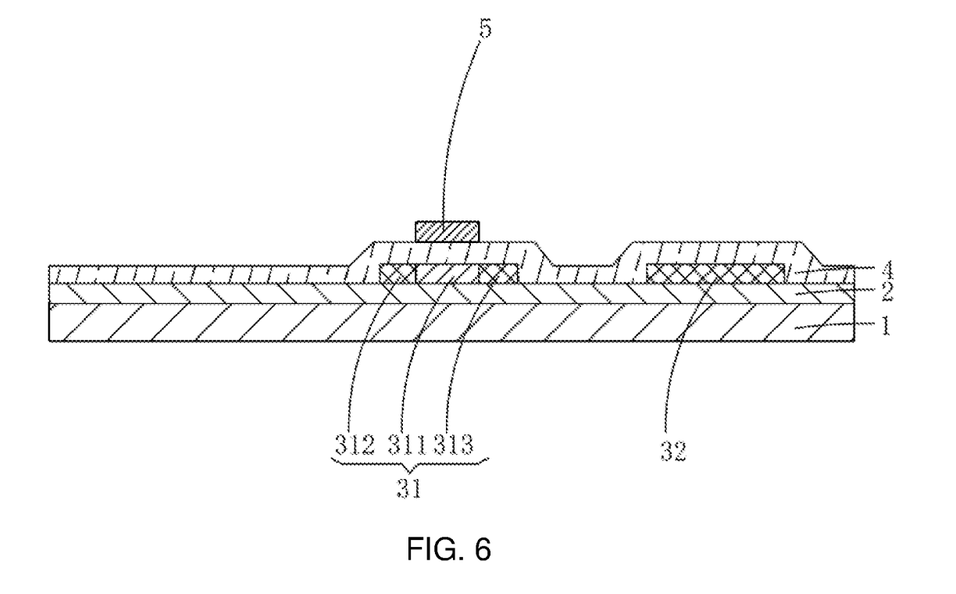
FIG. 6 is a schematic diagram showing Step S4 of a method for manufacturing a TFT array substrate according to the present invention.

In Step S4, referring to FIG. 6, the second semiconductor pattern 39 is doped to form a first capacitor plate 32 while doping the first semiconductor pattern 38 using the gate 5 as a mask, in a self-aligned manner, to form the active pattern 31.

Specifically, the active pattern 31 includes a channel 311 corresponding to the gate 5 and a source contact region 312 and a drain contact region 313 disposed at both ends of the channel 311, respectively.

Figure 7:
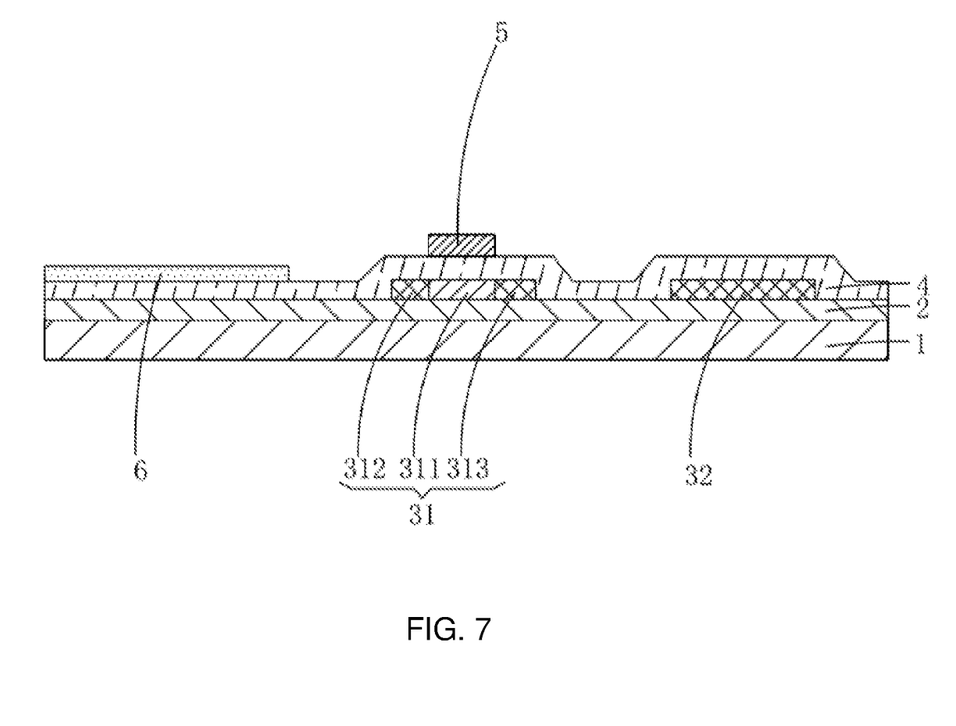
FIG. 7 is a schematic diagram showing Step S5 of a method for manufacturing a TFT array substrate according to the present invention.

In Step S5, referring to FIG. 7, a conductive material film is formed on the gate insulating layer 4 and patterned by using a third mask to form a first electrode 6 spaced apart from the active pattern 31 in a horizontal direction.

Specifically, the first electrode 6 formed in Step S5 is also spaced apart from the first capacitor plate 32 in the horizontal direction.

Specifically, in Step S5, the conductive material film is formed on the gate insulating layer 4 by physical vapor deposition. The conductive material film includes an aluminum film sandwiched between two indium-tin oxide films or a stacked structure including a single-layer indium-tin oxide (ITO) film, a single-layer aluminum film and a single-layer indium-zinc oxide (IZO) film.

Figure 8:
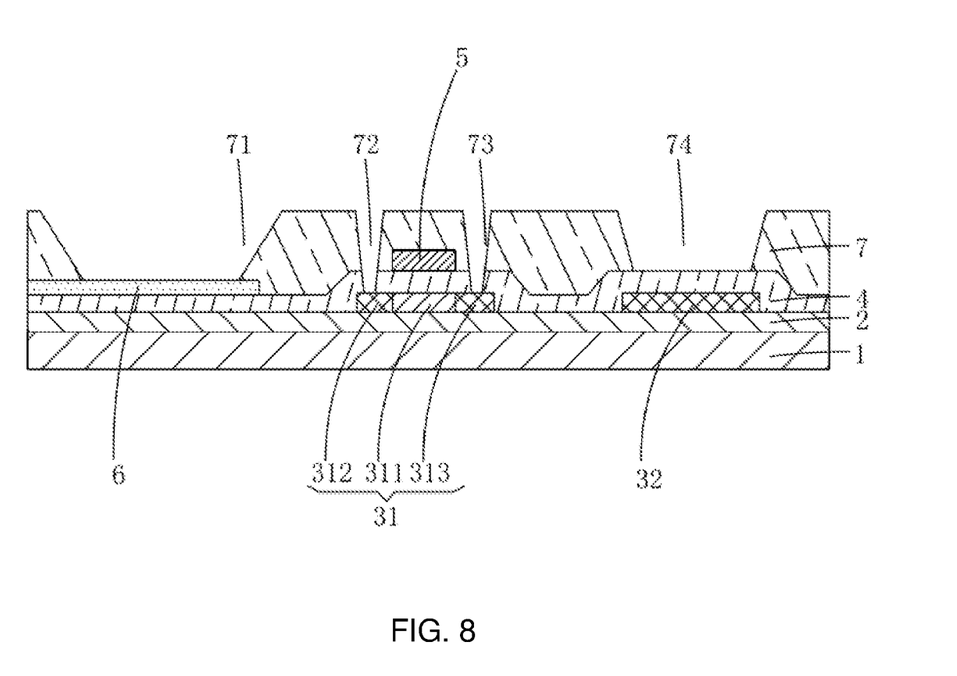
FIG. 8 is a schematic diagram showing Step S6 of a method for manufacturing a TFT array substrate according to the present invention.

In Step S6, referring to FIG. 8, an interlayer dielectric layer 7 is formed on the first electrode 6, the gate 5 and the gate insulating layer 4, and the interlayer dielectric layer 7 and the gate insulating layer 4 are patterned by using a fourth mask to form a first opening 71 above the first electrode 6 and form a first via 72 and a second via 73 respectively above both ends of the active pattern 31. A third opening 74 is formed above the gate insulating layer 4 on the first capacitor plate 32.

Specifically, in Step S6, the first via 72 and the second via 73 are respectively disposed above the source contact region 312 and the drain contact region 313.

Specifically, in Step S6, the interlayer dielectric layer 7 is formed on the first electrode 6, the gate 5 and the gate insulating layer 4 by plasma-enhanced chemical vapor deposition. The interlayer dielectric layer 7 includes a silicon oxide layer, a silicon nitride layer or a stacked structure including a silicon oxide layer and a silicon nitride layer.

Figure 9:
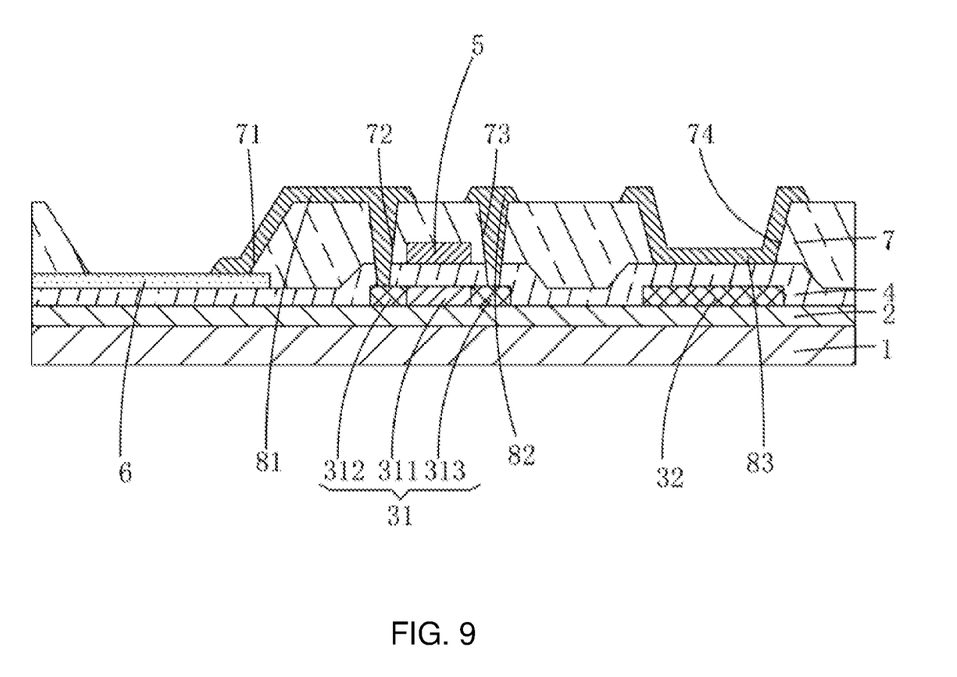
FIG. 9 is a schematic diagram showing Step S7 of a method for manufacturing a TFT array substrate according to the present invention.

In Step S7, referring to FIG. 9, a second metal film is formed on the first electrode 6 and the interlayer dielectric layer 7 and patterned by using a fifth mask to form a source 81 and a drain 82 spaced apart from each other, and a second capacitor plate 83. The source 81 and the drain 82 are in contact with the both ends of the active pattern 31 through the first via 72 and the second via 73, respectively. One end of the source 81 adjacent to the first electrode 6 is in contact with one end of the first electrode 6 adjacent to the source 81 through the first opening 71. The second capacitor plate 83 is disposed above the first capacitor plate 32 and covers the third opening 74.

Specifically, the source 81 and the drain 82 are respectively connected to the source contact region 312 and the drain contact region 313 through the first via 72 and the second via 73.

Specifically, in Step S7, the second metal film is formed on the first electrode 6 and the interlayer dielectric layer 7 by physical vapor deposition. The second metal film includes an aluminum film sandwiched between two titanium films or an aluminum film sandwiched between two molybdenum films.

Figure 10:
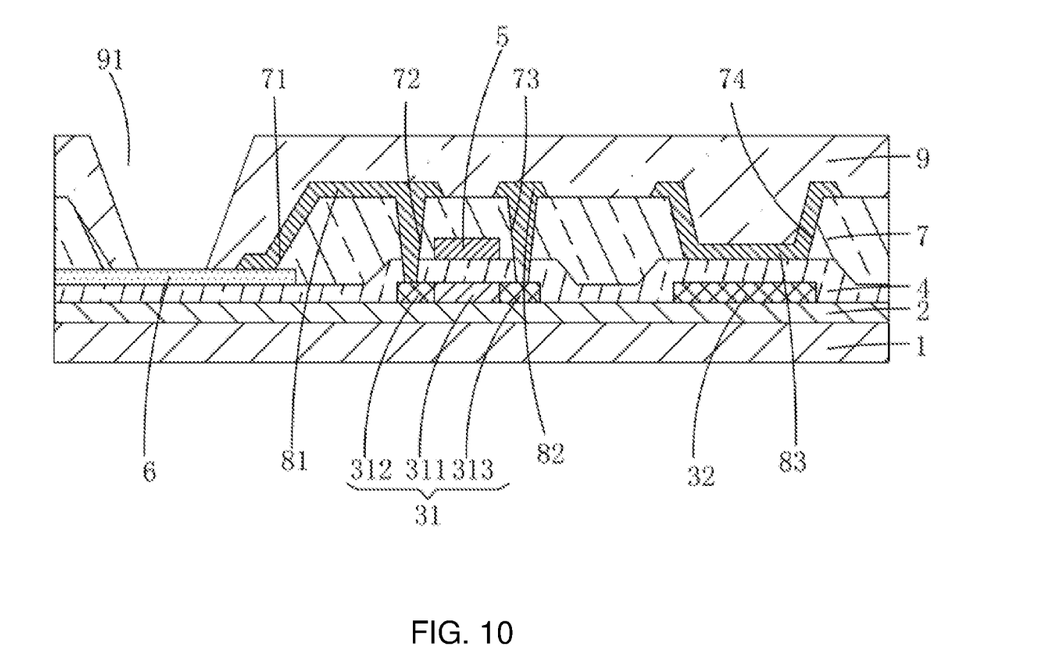
FIG. 10 is a schematic diagram showing Step S8 of a method for manufacturing a TFT array substrate according to the present invention.

In Step S8, referring to FIG. 10, a planarization layer 9 is formed on the interlayer dielectric layer 7, the first electrode 6, the source 81, the drain 82 and the second capacitor plate 83 and is patterned by using a sixth mask to form a second opening 91 in the first opening 71 above the first electrode 6.

In Step S8, the planarization layer 9 is coated on the interlayer dielectric layer 7, the first electrode 6, the source 81 and the drain 82 by a coating machine. The planarization layer 9 includes an organic material.

Figure 11:
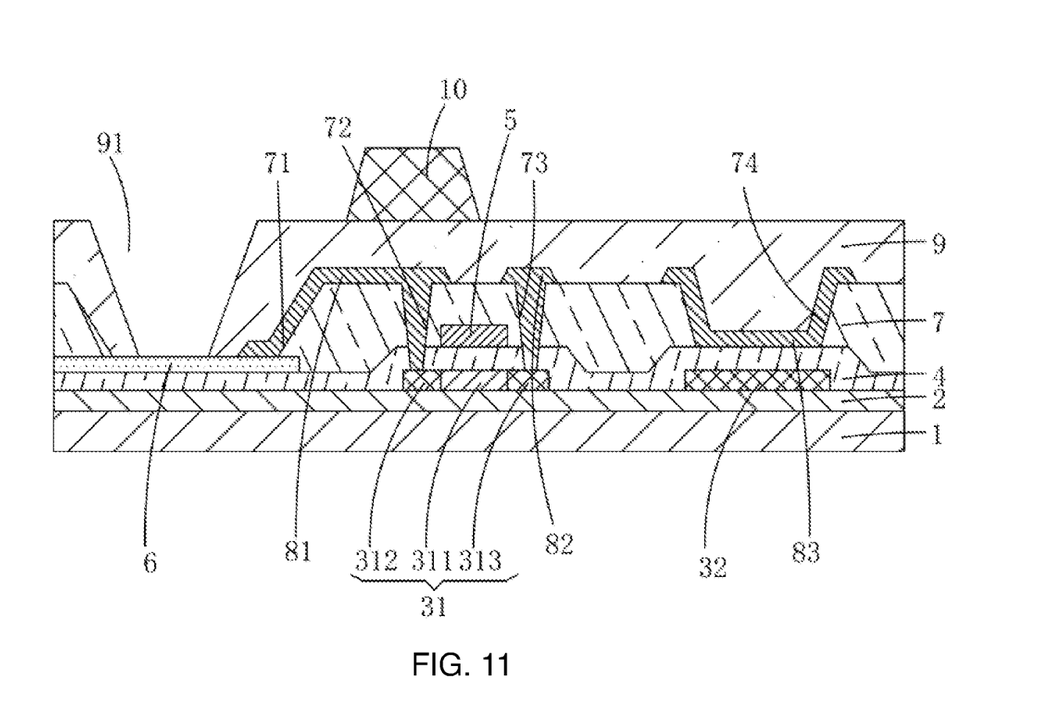
FIG. 11 is a schematic diagram showing Step S9 of a method for manufacturing a TFT array substrate according to the present invention and a schematic structural diagram of a TFT array substrate according to the present invention.

In Step S9, referring to FIG. 11, an organic material film is formed on the planarization layer 9 and is patterned to form a spacer 10.

Specifically, in Step S9, the organic material film is coated on the planarization layer 9 by a coating machine.

It should be noted that, in the method for manufacturing the TFT array substrate according to the present invention, the active pattern 31 and the first capacitor plate 32 are formed by using the first mask, the gate 5 is formed by using the second mask, the first electrode 6 is formed by using the third mask, the first opening 71, the first via 72, the second via 73 and the third opening 74 on the interlayer dielectric layer 7 and the gate insulating layer 4 are formed by using the fourth mask, the source 81, the drain 82 and the second capacitor plate 83 are formed by using the fifth mask, the second opening 91 on the planarization layer 9 is formed by using the sixth mask, and the spacer 10 is formed by using the seventh mask. A total of 7 masks are required. Compared with the prior art, which requires 9 masks to complete the manufacture of a TFT array substrate, the method according to the invention requires a smaller number of masks and simple processes to effectively improve the production efficiency and reduce the product cost.

Based on the same inventive concept, referring to FIG. 11, the present invention further provides a TFT array substrate manufactured by the foregoing method for manufacturing a TFT array substrate. The TFT array substrate includes a base substrate 1, an active pattern 31 disposed on the base substrate 1, a gate insulating layer 4 disposed on the base substrate 1 and the active pattern 31, a gate 5 disposed on the gate insulating layer 4 and above the active pattern 31, a first electrode 6 disposed on the gate insulating layer 4 and spaced apart from the active pattern 31 in a horizontal direction, an interlayer dielectric layer 7 disposed on the first electrode 6, the gate 5 and the gate insulating layer 4, and a source 81 and a drain 82 disposed on the interlayer dielectric layer 7 and spaced apart from each other.

The gate 5 exposes both ends of the active pattern 31. The interlayer dielectric layer 7 is provided with a first opening 71 above the first electrode 6. The interlayer dielectric layer 7 and the gate insulating layer 4 are respectively provided with a first via 72 and a second via 73 disposed above the both ends of the active pattern 31. The source 81 and the drain 82 are in contact with the both ends of the active pattern through the first via 72 and the second via 73, respectively. One end of the source 81 adjacent to the first electrode 6 is in contact with one end of the first electrode 6 adjacent to the source 81 through the first opening 71.

Specifically, the TFT array substrate further includes a barrier layer 2 disposed on the base substrate 1, a first capacitor plate 32 disposed on the barrier layer 2 and spaced apart from the active pattern 31, a second capacitor plate 83 disposed on the interlayer dielectric layer 7 and spaced apart from the source 81 and the drain 82, a planarization layer 9 disposed on the interlayer dielectric layer 7, the first electrode 6, the source 81, the drain 82 and the second capacitor plate 83, and a spacer 10 disposed on the planarization layer 9. The active pattern 31 is disposed on the barrier layer 2. The gate insulating layer 4 is disposed on the active pattern 31, the barrier layer 2 and the first capacitor plate 2. The first electrode 6 is spaced apart from the first capacitor plate 32 in the horizontal direction. The planarization layer 9 is provided with a second opening 91 above the first electrode 6 in the first opening 71. The interlayer dielectric layer 7 forms a third opening 74 above the gate insulating layer 4 on the first capacitor plate 32. The second capacitor plate 83 is disposed above the first capacitor plate 32 and covers the third opening 74. Thereby, a TFT device is composed of the gate 5, the active pattern 31, the source 81 and the drain 82, and a storage capacitor is composed of the first capacitor plate 31 and the second capacitor plate 83.

Specifically, the barrier layer 2 includes a silicon oxide layer, a silicon nitride layer, or a stacked structure including a silicon oxide layer and a silicon nitride layer. The active pattern 31 and the second capacitor plate 83 include polycrystalline silicon, and the both ends of the active pattern 31 exposed by the gate 5 and the second capacitor plate 83 are ion-doped. The gate insulating layer 4 includes a silicon oxide layer, a silicon nitride layer, or a stacked structure including a silicon oxide layer and a silicon nitride layer. The gate 5 includes one of a single-layer molybdenum film, a single-layer chromium film, a single-layer tungsten-molybdenum film, an aluminum film sandwiched between two titanium films, and an aluminum film sandwiched between two molybdenum films. The first electrode 6 includes an aluminum film sandwiched between two indium-tin oxide films or a stacked structure including a single-layer indium-tin oxide film, a single-layer aluminum film and a single-layer indium-zinc oxide film. The interlayer dielectric layer 7 includes a silicon oxide layer, a silicon nitride layer, or a stacked structure including a silicon oxide layer and a silicon nitride layer. The source 81, the drain 82 and the second capacitor plate 83 include an aluminum film sandwiched between two titanium films or an aluminum film sandwiched between two molybdenum films. The planarization layer 9 includes an organic material.

Specifically, the active pattern 31 includes a channel 311 corresponding to the gate 5 and a source contact region 312 and a drain contact region 313 disposed at both ends of the channel 311, respectively. The first via 72 and the second via 73 are respectively disposed above the source contact region 312 and the drain contact region 313 such that the source 81 and the drain 82 are respectively connected to the source contact region 312 and the drain contact region 313 through the first via 72 and the second via 73.

It should be noted that the TFT array substrate according to the present invention is manufactured by the foregoing method for manufacturing a TFT array substrate. During the manufacture, the active pattern 31 and the first capacitor plate 32 are formed by using the first mask, the gate 5 is formed by using the second mask, the first electrode 6 is formed by using the third mask, the first opening 71, the first via 72, the second via 73 and the third opening 74 on the interlayer dielectric layer 7 and the gate insulating layer 4 are formed by using the fourth mask, the source 81, the drain 82 and the second capacitor plate 83 are formed by using the fifth mask, the second opening 91 on the planarization layer 9 is formed by using the sixth mask, and the spacer 10 is formed by using the seventh mask. A total of 7 masks are required to complete the manufacture of the TFT array substrate. Compared with the prior art, which requires 9 masks to complete the manufacture of a TFT array substrate, the number of required masks in the invention is smaller and the processes are simpler, which effectively improves the production efficiency and reduces the product cost.

Figure 12:
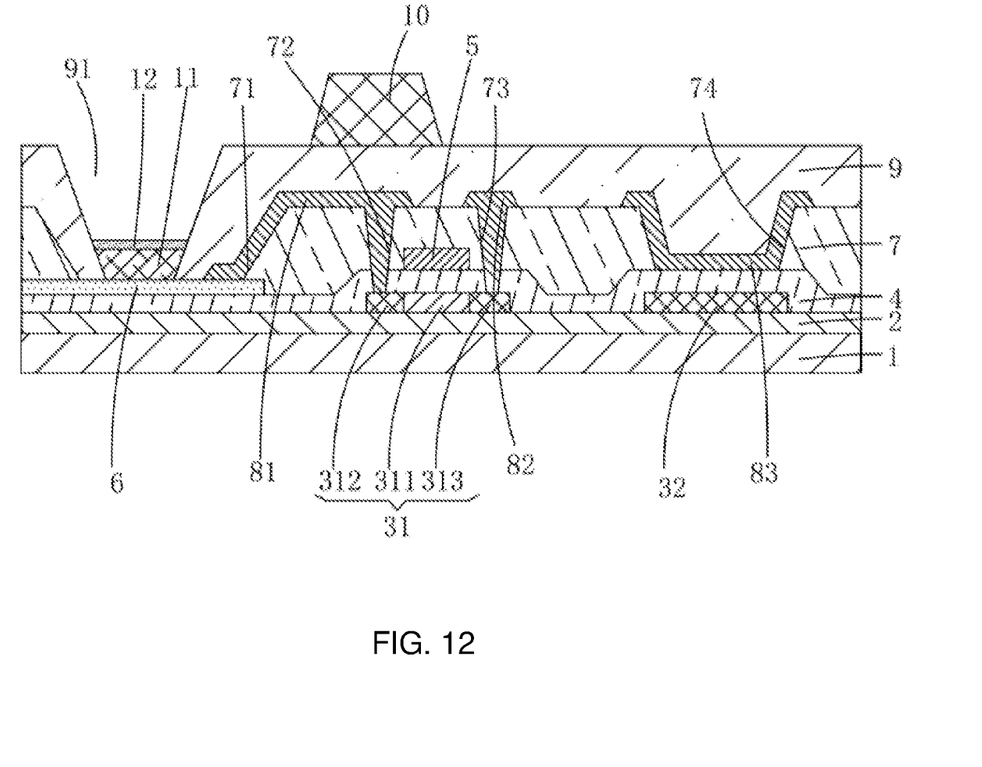
FIG. 12 is a schematic structural diagram of an OLED display panel according to the present invention.

Referring to FIG. 12, based on the same inventive concept, the present invention further provides an OLED display panel, which includes the foregoing TFT array substrate. The structure of the TFT array substrate is not repeatedly described herein. The OLED display panel further includes an organic light-emitting layer 11 on the first electrode 6 and a second electrode 12 on the organic light-emitting layer 11 in the second opening 91. Thereby, an OLED device is composed of the first electrode 6, the organic light-emitting layer 11, and the second electrode 12.

It should be noted that, during the manufacture of the OLED display panel according to the present invention, the active pattern 31 and the first capacitor plate 32 are formed by using the first mask, the gate 5 is formed by using the second mask, the first electrode 6 is formed by using the third mask, the first opening 71, the first via 72, the second via 73 and the third opening 74 on the interlayer dielectric layer 7 and the gate insulating layer 4 are formed by using the fourth mask, the source 81, the drain 82 and the second capacitor plate 83 are formed by using the fifth mask, the second opening 91 on the planarization layer 9 is formed by using the sixth mask, and the spacer 10 is formed by using the seventh mask. A total of 7 masks are required to complete the manufacture of the OLED display panel. Compared with the prior art, which requires 9 masks to complete the manufacture of an OLED display panel, the number of required masks in the invention is smaller and the processes are simpler, which effectively improves the production efficiency and reduces the product cost.

In summary, the method for manufacturing a TFT array substrate according to the present invention uses a mask to form an active pattern, a gate, a first electrode, a via and an opening in an interlayer dielectric layer and a gate insulating layer, a source, a drain, an opening in a planarization layer, and a spacer, respectively. The number of required masks is small and the processes are simple, which effectively improves the production efficiency and reduces the product cost. The TFT array substrate according to the present invention is manufactured with a small number of required masks, simple processes, and reduced product cost. The OLED display panel according to the present invention is manufactured with a small number of required masks, simple processes, and reduced product cost.

In the above, for those with ordinary skill in the art, various other changes and modifications can be made according to the technical solutions and technical concept of the present invention, and all such changes and modifications are within the scope of the claims of the present invention.

What is claimed is:

1. A method for manufacturing a thin-film transistor (TFT) array substrate, comprising the steps of:
   Step S1, providing a base substrate, on which a semiconductor material film is formed and patterned to form a first semiconductor pattern;
   Step S2, forming a gate insulating layer on the first semiconductor pattern and the substrate;
   Step S3, forming and patterning a first metal film on the gate insulating layer to form a gate above the first semiconductor pattern, the gate exposing both ends of the first semiconductor pattern;
   Step S4, doping the first semiconductor pattern using the gate as a mask to form an active pattern;
   Step S5, forming and patterning a conductive material film on the gate insulating layer to form a first electrode spaced apart from the active pattern in a horizontal direction;
   Step S6, forming an interlayer dielectric layer on the first electrode, the gate and the gate insulating layer, and patterning the interlayer dielectric layer and the gate insulating layer to form a first opening above the first electrode and form a first via and a second via respectively above both ends of the active pattern; and
   Step S7, forming and patterning a second metal film on the first electrode and the interlayer dielectric layer to form a source and a drain spaced apart from each other, the source and the drain being in contact with the both ends of the active pattern through the first via and the second via, respectively, and one end of the source adjacent to the first electrode being in contact with one end of the first electrode adjacent to the source through the first opening,
   wherein:
   in Step S3, the first metal film is formed on the gate insulating layer by physical vapor deposition, and the first metal film comprises one of a single-layer molybdenum film, a single-layer chromium film, a single-layer tungsten-molybdenum film, an aluminum film sandwiched between two titanium films, and an aluminum film sandwiched between two molybdenum films; and
   in Step S5, the conductive material film is formed on the gate insulating layer by physical vapor deposition, and the conductive material film comprises an aluminum film sandwiched between two indium-tin oxide films or a stacked structure comprising a single-layer indium-tin oxide film, a single-layer aluminum film and a single-layer indium-zinc oxide film.

2. The method for manufacturing a TFT array substrate of claim 1, wherein,
   in Step S1, a barrier layer is formed on the base substrate before the semiconductor material film is formed such that the semiconductor material film is formed on the barrier layer;
   in Step S2, the gate insulating layer is formed on the first semiconductor pattern and the barrier layer; and
   the method further comprises the steps of:
   Step S8, forming and patterning a planarization layer on the interlayer dielectric layer, the first electrode, the source and the drain to form a second opening in the first opening above the first electrode; and
   Step S9, forming and patterning an organic material film on the planarization layer to form a spacer.

3. The method for manufacturing a TFT array substrate of claim 1, wherein,
   in Step S1, a second semiconductor pattern spaced apart from the first semiconductor pattern is formed while patterning the semiconductor material film to form the first semiconductor pattern;
   in Step S2, the gate insulating layer is further formed on the second semiconductor pattern;
   in Step S4, the second semiconductor pattern is doped to form a first capacitor plate while doping the first semiconductor pattern using the gate as a mask to form the active pattern;
   the first electrode formed in Step S5 is spaced apart from the first capacitor plate in the horizontal direction;
   in Step S6, a third opening is formed above the gate insulating layer on the first capacitor plate while patterning the interlayer dielectric layer and the gate insulating layer to form the first opening, the first via, and the second via; and
   in Step S7, a second capacitor plate spaced apart from the source and the drain is formed while patterning the second metal film to form the source and the drain, and the second capacitor plate is disposed above the first capacitor plate and covers the third opening.

4. The method for manufacturing a TFT array substrate of claim 1, wherein
   the active pattern includes a channel corresponding to the gate and a source contact region and a drain contact region disposed at both ends of the channel, respectively; and
   the first via and the second via are respectively disposed above the source contact region and the drain contact region such that the source and the drain are respectively connected to the source contact region and the drain contact region through the first via and the second via.

5. The method for manufacturing a TFT array substrate of claim 2, wherein,
   in Step S1, the barrier layer is formed on the base substrate by plasma-enhanced chemical vapor deposition, and the barrier layer comprises a silicon oxide layer, a silicon nitride layer, or a stacked structure comprising a silicon oxide layer and a silicon nitride layer;
   the semiconductor material film comprises a polycrystalline silicon film, and forming the semiconductor material film on the barrier layer in Step S1 specifically comprises: forming a single-crystalline silicon film on the barrier layer by plasma-enhanced chemical vapor deposition and subjecting the single-crystalline silicon film to excimer laser annealing to form the polycrystalline silicon film;
   in Step S2, the gate insulating layer is formed on the first semiconductor pattern and the barrier layer by plasma-enhanced chemical vapor deposition, and the gate insulating layer comprises a silicon oxide layer, a silicon nitride layer, or a stacked structure comprising a silicon oxide layer and a silicon nitride layer;

in Step S6, the interlayer dielectric layer is formed on the first electrode, the gate and the gate insulating layer by plasma-enhanced chemical vapor deposition, and the interlayer dielectric layer comprises a silicon oxide layer, a silicon nitride layer or a stacked structure comprising a silicon oxide layer and a silicon nitride layer;

in Step S7, the second metal film is formed on the first electrode and the interlayer dielectric layer by physical vapor deposition, and the second metal film comprises an aluminum film sandwiched between two titanium films or an aluminum film sandwiched between two molybdenum films;

in Step S8, the planarization layer is coated on the interlayer dielectric layer, the first electrode, the source and the drain by a coating machine, and the planarization layer comprise an organic material; and in Step S9, the organic material film is coated on the planarization layer by a coating machine.

6. A TFT array substrate, comprising a base substrate, an active pattern disposed on the base substrate, a gate insulating layer disposed on the base substrate and the active pattern, a gate disposed on the gate insulating layer and above the active pattern, a first electrode disposed on the gate insulating layer and spaced apart from the active pattern in a horizontal direction, an interlayer dielectric layer disposed on the first electrode, the gate and the gate insulating layer, and a source and a drain disposed on the interlayer dielectric layer and spaced apart from each other;

wherein the gate exposes both ends of the active pattern, the interlayer dielectric layer is provided with a first opening above the first electrode, the interlayer dielectric layer and the gate insulating layer are respectively provided with a first via and a second via disposed above the both ends of the active pattern, the source and the drain are in contact with the both ends of the active pattern through the first via and the second via, respectively, and one end of the source adjacent to the first electrode is in contact with one end of the first electrode adjacent to the source through the first opening, wherein the gate comprises one of a single-layer molybdenum film, a single-layer chromium film, a single-layer tungsten-molybdenum film, an aluminum film sandwiched between two titanium films, and an aluminum film sandwiched between two molybdenum films; and the first electrode comprises an aluminum film sandwiched between two indium-tin oxide films or a stacked structure comprising a single-layer indium-tin oxide film, a single-layer aluminum film and a single-layer indium-zinc oxide film.

7. The TFT array substrate of claim 6, further comprising a barrier layer disposed on the base substrate, a first capacitor plate disposed on the barrier layer and spaced apart from the active pattern, a second capacitor plate disposed on the interlayer dielectric layer and spaced apart from the source and the drain, a planarization layer disposed on the interlayer dielectric layer, the first electrode, the source, the drain and the second capacitor plate, and a spacer disposed on the planarization layer;

wherein the active pattern is disposed on the barrier layer, the gate insulating layer is disposed on the active pattern, the barrier layer and the first capacitor plate, the first electrode is spaced apart from the first capacitor plate in the horizontal direction, the planarization layer is provided with a second opening above the first electrode in the first opening, the interlayer dielectric layer forms a third opening above the gate insulating layer on the first capacitor plate, the second capacitor plate is disposed above the first capacitor plate and covers the third opening.

8. The TFT array substrate of claim 7, wherein, the barrier layer comprises a silicon oxide layer, a silicon nitride layer, or a stacked structure comprising a silicon oxide layer and a silicon nitride layer;

the active pattern and the second capacitor plate comprise polycrystalline silicon, and the both ends of the active pattern exposed by the gate and the second capacitor plate are ion-doped;

the gate insulating layer comprises a silicon oxide layer, a silicon nitride layer, or a stacked structure comprising a silicon oxide layer and a silicon nitride layer;

the interlayer dielectric layer comprises a silicon oxide layer, a silicon nitride layer, or a stacked structure comprising a silicon oxide layer and a silicon nitride layer;

the source, the drain and the second capacitor plate comprise an aluminum film sandwiched between two titanium films or an aluminum film sandwiched between two molybdenum films; and the planarization layer comprises an organic material.

9. The TFT array substrate of claim 6, wherein the active pattern comprises a channel corresponding to the gate and a source contact region and a drain contact region disposed at both ends of the channel, respectively;

the first via and the second via are respectively disposed above the source contact region and the drain contact region such that the source and the drain are respectively connected to the source contact region and the drain contact region through the first via and the second via.

10. An OLED display panel, comprising the TFT array substrate of claim 6.

* * * * *